United States Patent [19]
Hanson

[11] 3,935,442
[45] Jan. 27, 1976

[54] PHOTOFLASH LAMP ARRAY HAVING ELECTRICALLY CONNECTED REFLECTOR

[75] Inventor: James M. Hanson, Euclid, Ohio

[73] Assignee: General Electric Company, Schenectady, N.Y.

[22] Filed: Sept. 26, 1974

[21] Appl. No.: 509,410

[52] U.S. Cl. ............................................. 240/1.3
[51] Int. Cl.² ..................................... G03B 15/02
[58] Field of Search .................. 240/1.3, 103 R; 317/101 CC, 101 DH, 101 F; 339/17 R; 354/126, 127, 148; 431/92, 93, 95 R, 95 A

[56] References Cited
UNITED STATES PATENTS

| | | |
|---|---|---|
| 3,127,112 | 3/1964 | McCammon et al. ............... 240/1.3 |
| 3,458,270 | 7/1969 | Ganser et al. ..................... 240/1.3 X |
| 3,473,880 | 10/1969 | Wick ................................ 240/1.3 X |
| 3,608,451 | 9/1971 | Kelem .............................. 240/1.3 X |

*Primary Examiner*—Fred L. Braun
*Attorney, Agent, or Firm*—Norman C. Fulmer; Lawrence R. Kempton; Frank L. Neuhauser

[57] ABSTRACT

A photoflash lamp array comprising a plurality of flash lamps having lead-in wires connected to a circuit board carrying switching circuitry for sequentially firing the flash lamps. An electrically conductive reflector unit is positioned between the lamps and the circuit board. A conductive clip is clipped to the reflector unit and touches against an electrical ground point on the circuit board, whereby the reflector unit functions as an electrical shield for the circuitry.

7 Claims, 4 Drawing Figures

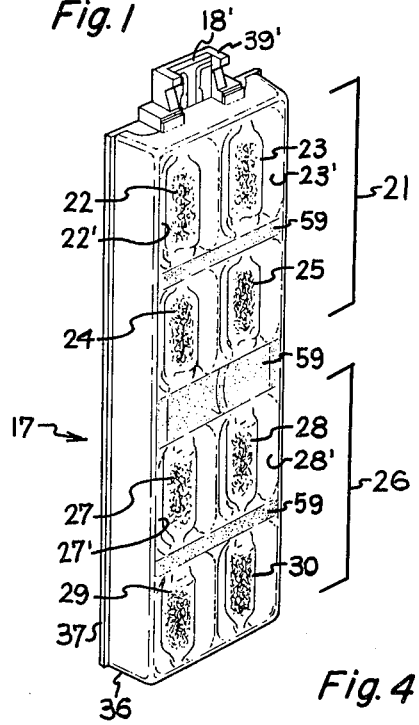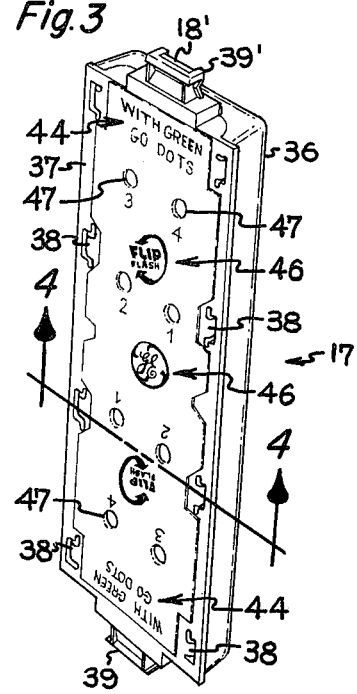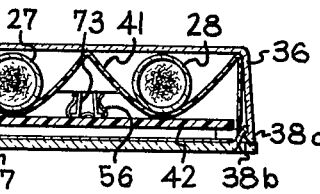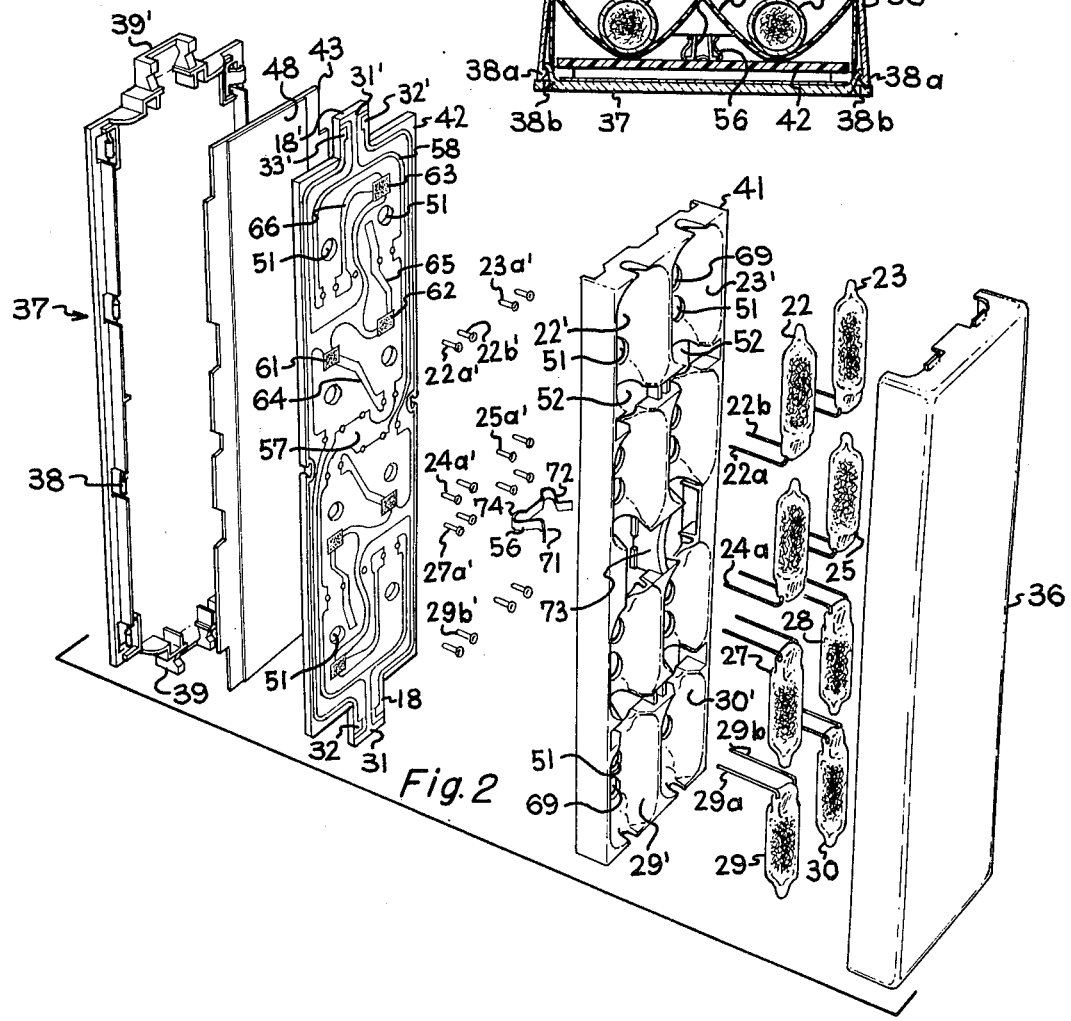

PHOTOFLASH LAMP ARRAY HAVING ELECTRICALLY CONNECTED REFLECTOR

CROSS-REFERENCES TO RELATED APPLICATIONS

Ser. No. 448,671, filed Mar. 6, 1974, Kurt H. Weber, "Multiple Flash Lamp Unit", assigned the same as this invention.

Ser. No. 485,459, filed July 3, 1974, Richard Blount, "Multiple Flash Lamp Unit", assigned the same as this invention.

Ser. No. 485,422, filed July 3, 1974, Paul T. Cote, "Multiple Flash Lamp Unit", assigned the same as this invention.

Ser. No. 485,460, filed July 3, 1974, Paul T. Cote, "Protective Terminal for Multiple Flash Lamp Unit", assigned the same as this invention.

Ser. No. 499,316, filed Aug. 21, 1974, Paul T. Cote, "Connector for Photoflash Array", assigned the same as this invention.

Ser. No. 508,334, filed Sept. 23, 1974, Richard Blount, "Photoflash Array Construction", assigned the same as this invention.

Ser. No. 509,411 now U.S. Pat. No. 3,894,226, James M. Hanson, filed concurrently herewith, "Photoflash Lamp Array Having Means for Preventing Electrical Shorting", assigned the same as this invention.

BACKGROUND OF THE INVENTION

The invention is in the field of multiple photoflash lamp units, such as planar arrays.

The above-referenced patent applications disclose multiple flash lamp arrays comprising a plurality of flash lamps having their lead-in wires connected to a circuit board provided with switching circuitry for causing sequential flashing of the lamps, and reflectors are positioned between the lamps and the circuit board. As is particularly disclosed in the first two above-referenced Cote patent applications, the reflectors for the lamps can be made as a single reflector member or unit shaped to provide multiple individual reflectors for the lamps. The reflector member preferably is electrically conductive, such as by being made of metal or metal-coated plastic, and is electrically connected to an electrical "ground" portion of the circuitry on the circuit board. Thus, the reflector member functions as an electrical shield and increases the stray capacitance to ground of the electrical "ground" of the circuitry, reducing the possibility of accidental flashing of lamps by electrostatic voltage charge on a person or object touching the array, which accidental flashing is particularly prone to occur if the lamps are high voltage types requiring a firing voltage of 1000 or 2000 volts, for example, at low current.

SUMMARY OF THE INVENTION

Objects of the invention are to provide an improved flash array construction and to provide an improved electrical connection between a reflector member and a circuit board that is feasible and economical to manufacture.

The invention comprises, briefly and in a preferred embodiment, a multiple flash lamp array containing a plurality of flash lamps having lead-in wires connected to a circuit board carrying circuitry for flashing the lamps. An electrically conductive reflector unit is positioned between the lamps and the circuit board. An electrically conductive clip is clipped to the reflector unit and touches against an electrical ground point on the circuit board, whereby the reflector unit functions as an electrical shield and increases the stray capacitance to ground of the electrical ground of the circuitry, reducing the possibility of accidental flashing of lamps by electrostatic voltage charge on a person or object touching the array. Preferably, the array is provided with a group of connector terminals for electrically connecting the circuitry of the array to a camera socket, one of these terminals being electrically connected to electrical ground of the array and being shaped and arranged to be more readily touchable than the other terminals of the group when the array is handled. The array can include features disclosed in the above-referenced patent applications, including lamp arrangement and connections so that the array can be attached to a camera in different orientations in each of which only a group of lamps relatively far away from the camera lens axis will be flashed, thereby reducing the likelihood of an undesirable "red-eye" effect which causes a person's pupils to appear red if the flashing lamp is close to the lens axis.

BRIEF DESCRIPTION OF THE DRAWING

FIG. 1 is a perspective view of a multiple flash lamp array in accordance with a preferred embodiment of the invention.

FIG. 2 is an exploded view of the array of FIG. 1 showing the internal parts.

FIG. 3 is a perspective view of the back of the array.

FIG. 4 is a sectional view taken on the line 4—4 of FIG. 3.

DESCRIPTION OF THE PREFERRED EMBODIMENT

A multiple flash lamp unit 17 of the planar array type and containing a plurality of electrically fired flash lamps is provided with a plug-in connector tab 18 at the lower side or end thereof, adapted to fit into a socket of a camera or flash adapter as shown and described in the above-referenced patent applications. The lamp array 17 is provided with a second plug-in connector tab 18' at the top side or end thereof, whereby the array 17 is adapted to be attached to the camera socket in either of two orientations, i.e., with either the tab 18 or the tab 18' plugged into the socket. The array 17 is provided with an upper group 21 of flash lamps 22, 23, 24, and 25, and a lower group 26 of flash lamps 27, 28, 29, and 30, the lamps being arranged in a planar configuration. Reflectors 22', etc., are disposed behind the respective flash lamps, so that as each lamp is flashed its light is projected forwardly of the array 17. The lamps are arranged and connected so that when the array is connected to a camera by the connector 18, only the upper group 21 of lamps will be flashed, and when the array is turned end for end and connected to the camera by the other connector 18', only the then upper group 26 of lamps will be flashed. By this arrangement, only lamps relatively far from the lens axis are flashable, thus reducing the undesirable red-eye effect, as is more fully described in the above-referenced patent applications.

The construction of the array, also disclosed in the last above-referenced Blount application, comprises front and back housing members 36 and 37, which preferably are made of plastic and are provided with interlocking members 38 which can be molded integrally with the housing members and which lock the housing members together in final assembly to form a unitary flash array structure. FIG. 4 shows a pair of interlocking members 38a carried at the rear of the side of the front housing member 36 interlocked with a pair of interlocking members 38b of the back housing member 37. In the preferred embodiment shown, the front housing member 36 is a rectangular concavity and the back housing member 37 is substantially flat and includes integral extensions 39 and 39' at the ends thereof which partly surround and protect the connector tabs 18 and 18' and also function to facilitate mechanical attachment to the camera socket. Sandwiched between the front and back housing members 36 and 37, in the order named, are the flash lamps 22, etc., a unitary reflector member 41 (preferably of aluminum-coated plastic) shaped to provide the individual reflectors 22', etc., a printed circuit board 42 provided with integral connector tabs 18 and 18', and an indicia sheet 43 which may be provided with instructions, information 44, trademarks 46, and other indicia such as flash indicators 47 located behind the respective lamps and which change color due to heat and/or light radiation from a flashing lamp, thus indicating at a glance which of the lamps have been flashed and not flashed.

The indicia sheet 43 may be of paper or thin cardboard and provided with openings where the flash indicators 47 are desired, and flash indicator material, such as a sheet-like heat-sensitive plastic material, for example biaxially oriented polypropylene, which shrinks or melts when subjected to heat or radiant energy from an adjacent flashing lamp thus effectively changing the color of the openings in the indicia sheet 43. For example, the plastic material can be colored green on its back side by ink or other suitable means, and the green disappears and the opening becomes a different color (dark, for example) when the plastic shrinks or melts away due to heat from an adjacent flashing lamp. The front of the plastic (toward the lamps) should be coated with dark ink so as to absorb heat more readily. A single flash indicator sheet 48 may be arranged over all of the flash indicator openings. Openings 51 are provided through the reflector unit 41 and the circuit board 42 to facilitate radiation from flashing lamps reaching the flash indicators 47. The rear housing member 37 is transparent (either of clear material or provided with window openings) to permit viewing of the indicia on the indicia sheet 43. The front housing member 36 is transparent at least in front of the lamps 22, etc., to permit light from flashing lamps to emerge frontwardly of the array, and may be tinted to alter the color of light from the flash lamps.

The height and width of the rectangular array are substantially greater than its thickness, and the heights and widths of the reflector member 41 and circuit board 42 are substantially the same as the interior height and width of the housing member 36, to facilitate holding the parts in place.

The tab 18, which is integral with the circuit board 42, is provided with a pair of electrical terminals 31 and 32, and similarly the tab 18' is provided with a pair of terminals 31' and 32', for contacting terminals of a camera socket for applying firing voltage pulses to the array. Each tab is provided with a third terminal 33 and 33', respectively, which functions to electrically short the circuitry of the inactive lower group of lamps, when the array is plugged into a socket, as is described in the first above-referenced Blount patent application. The terminals 31 and 31' are shown as having a lateral "T-bar" configuration for temporarily shorting the socket terminals while the array is being plugged in, to discharge any residual voltage charge in the firing pulse source and also to reduce the likelihood of lamps being accidentally flashed by electrostatic voltage when the array is handled, as is disclosed in the above-referenced Cote patent application Ser. No. 485,460.

The circuit board 42 has a "printed circuit" thereon, as will be described, for causing sequential flashing of the lamps by firing voltage pulses applied to the terminals 31, 32 or 31', 32'. The top and bottom halves of the printed circuitry preferably are reverse mirror images of each other. The lead wires 22a, 22b, etc., of the lamps 22, etc., may be attached to the circuit board 42 in various ways, such as by means of metal eyelets 22a', 22b', etc., placed through openings in the board. The lead wires 22a, 22b, etc., pass through openings 52 in the reflector member 41 and into or through the respective pairs of eyelets 22a', 22b', etc., and the ends of the eyelets are crimped or bent to hold the lead wires and make electrical contact thereto and also to hold the eyelets in place with their heads in electrical contact with the circuit of the circuit board.

In accordance with the invention, clip 56 is clipped onto the reflector member 41, which reflector preferably is made of metal-coated plastic, and the rear of the clip 56 rests in touching contact against an area 57 of an electrical ground circuit run 58 on the board and which includes the terminals 31 and 31' and which makes contact with one of the connector eyelets 22a' or 22b', etc., for each of the lamps 22, etc., whereby the reflector unit 41 additionally functions as an electrically grounded shield, as will be described.

Areas 59 on the transparent front housing member 36 may be made opaque or partly opaque, such as by making the surface roughened at these areas, to fully or partly conceal the lamp lead-in wires 22a, 22b, etc., and/or the lower portions of the lamps, for improved appearance of the array.

The circuit board terminal 32 is part of a conductor run that is electrically connected to lead-in wire 24a of lamp 24 at the eyelet 24a' and terminates at radiation switches 61, 62, and 63 respectively positioned near lamps 24, 25, and 23. A circuit board conductor run 64 is connected electrically to the remaining lead wire of flash lamp 25 at eyelet 25a' and terminates at the radiation switch 61. A circuit board conductor run 65 is connected to the remaining lead-in wire of flash lamp 23 at eyelet 23a' and terminates at the radiation switch 62. Similarly, a circuit board conductor run 66 is connected to the remaining lead-in wire of flash lamp 22 at eyelet 22b' and terminates at radiation switch 63.

The radiation switches 61, 62, and 63 are respectively in contact with and bridge across the circuit runs that are connected to them. The material for the radiation switches may be suitable material initially having an open circuit or high resistance, the resistance thereof becoming zero or a low value when the material receives radiation in the form of heat and/or light from a respective adjacent lamp, upon the lamp being flashed. For this purpose, each of the radiation switches is respectively positioned behind and near to a flash lamp 24, 25, 23. Windows in the form of transparent sections or openings 69 may be provided in the reflectors in front of the switches as shown in FIG. 2 to facilitate radiation transfer. A suitable material for the radiation switches is silver oxide dispersed in a binder such as polyvinyl resin. Each of these radiation switches, upon receiving heat and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the same circuit shown in the upper part of the circuit board, and therefore will not be described in detail. It will be noted that the circuit runs from the plugged-in terminals 31 and 32 at the lower part of the circuit board extend upwardly so as to activate the circuitry in the upper half of the circuit board. Similarly, when the unit is turned around and tab 18' is plugged into a socket, the circuit board terminals 31' and 32' will be connected to and activate the lamps which then will be in the upper half of the circuit board, and hence in the upper half of the flash unit 17. This accomplishes, as has been stated, the desirable characteristic whereby only the group of lamps relatively farthest away from the lens axis will be flashed, thereby reducing or eliminating the undesirable red-eye effect.

The circuit on the circuit board 42 functions as follows. Assuming that none of the four lamps in the upper half of the unit 17 have been flashed, upon occurrence of a first firing pulse applied across the terminals 31, 32, this pulse will be directly applied to the lead-in wires of the first-connected flash lamp 24, whereupon the lamp 24 flashes and becomes an open circuit between its lead-in wires. Heat and/or light radiation from the flashing first lamp 24 causes the adjacent radiation switch 61 to become a closed circuit (or a low value of resistance), thereby connecting the circuit board terminal 32 electrically to the lead-in wire of the second lamp 25 at eyelet 25a'. By the time this occurs, the firing pulse has diminished to a value insufficient to cause the second lamp 25 to flash. When the next firing pulse occurs, it is applied to the lead-in wires of the second lamp 25, via the now closed radiation switch 61, whereupon the second lamp 25 flashes, thereby causing radiation switch 62 to assume zero or low resistance, and the second lamp 25 now has an open circuit or high resistance between its lead-in wires. When the next firing pulse occurs, it is applied via now closed radiation switch 62 to the third lamp 23, thereby firing the lamp which becomes an open circuit, and the radiation from it causes the radiation switch 63 to become essentially a closed circuit across its terminals. Thus, the next firing pulse will be applied, via now closed radiation switch 63, to the lead-in wires of the fourth flash lamp 22, thereupon causing the lamp to flash. Since this lamp is the last lamp in the active circuit, it does not matter whether its lead-in wires are an open or closed circuit after flashing. Additional flash lamps, radiation switches, and electrical conductors can be employed, if desired, using the just described principles. When the flash unit is turned around and the other connector tab 18' attached to the camera socket, the group of lamps that then become uppermost and relatively farthest away from the lens axis will be in an active circuit and will be flashed in the same manner as has been described. In a preferred embodiment, the lamps 22, etc., are high voltage types, requiring about 2000 volts for example, at low current, for flashing, and they can be fired by impacting or stressing a piezoelectric element in the camera, as disclosed in U.S. Pat. Nos. 2,972,937 and 3,106,080 to C. G. Suits.

Now again referring to the electrical connector clip 56 of the invention, the clip preferably is generally U-shaped, with the legs 71 and 72 thereof curved convexly toward each other so as to grip and clip onto the sides of a vertical web 73 formed in the reflector unit 41 by means of openings through the reflector unit flanking the web 73 and also functioning as openings 52 through the reflector unit for the lead-in wires of lamps 24, 25, 27, and 28. The web 73 may have double walls as shown in FIG. 4. The clip 56 may be shaped to form one or more rearwardly extending loops 74 which resiliently press against the electrical ground area 57 of the circuit board in the final assembly to insure good electrical contact. The reflector unit 41 may be of plastic with a metal coating on only its front surface (consisting primarily of the individual reflectors 22', etc.) and the sides of the web 73, whereby the clip 56 is electrically connected to the front surface of the reflector unit.

It has been found that the invention achieves its objective of providing an electrical connection between the reflector unit 41 and circuit board 42 and is feasible and economical to manufacture. This connection, as disclosed in the first two above-referenced Cote patent applications, electrically connects the conductive reflector unit 41 to the more readily touchable electrical ground terminals 31 and 31' of the array, so that when these terminals are touched by an electrostatically charged person or object, the reflector unit functions as a shield (connected to the terminals 31 and 31') having relatively large stray capacitance to ground, whereby a relatively large amount of the electrostatic voltage will be dissipated to ground rather than flowing through the primers or other flash ignition means of the lamp 22, etc.

While preferred embodiments of the invention have been shown and described, various other embodiments and modifications thereof will become apparent to persons skilled in the art, and will fall within the scope of the invention as defined in the following claims.

What I claim as new and desire to secure by Letters Patent of the United States is:

1. A multiple flash lamp array comprising a plurality of electrically fired flash lamps each having a pair of lead-in conductors, a circuit board containing thereon circuitry for sequentially firing said flash lamps, means electrically connecting said lead-in conductors of the flash lamps to said circuitry, and an electrically conductive reflector unit positioned between said lamps and said circuit board and shaped to reflect light from said lamps when flashed, said circuitry including a conductive area on said circuit board, said reflector unit including a web, a U-shaped conductive clip positioned between and in electrical contact with said conductive reflector unit and said conductive area on the circuit board and arranged so that the legs thereof are clipped against said web, said web and said conductive area being relatively aligned one behind the other and the base of said U-shaped clip extending against said conductive area on the circuit board.

2. An array as claimed in claim 1, in which the legs of said clip are curved convexly toward each other.

3. An array as claimed in claim 1, in which the base of said U-shaped clip includes at least one loop extending toward and resiliently against said conductive area on the circuit board.

4. An array as claimed in claim 1, in which said web is a double-wall web having two spaced apart mutually parallel walls, said legs of the clip being against the outer surfaces of said two walls, respectively.

5. An array as claimed in claim 1, in which said web includes sides and is flanked by openings extending through said reflector unit from front to back thereof, said reflector unit being made of plastic material coated with an electrically conductive material at least over the front surface thereof and over the sides of said web.

6. An array as claimed in claim 1, in which said array is provided with a group of connector terminals positioned and arranged so that one of said connector terminals is more readily touchable than the rest, and means electrically connecting said more readily touchable connector terminal to said conductive area on the circuit board.

7. An array as claimed in claim 1, in which said conductive area on the circuit board is electrically connected to a lead-in wire of each of said flash lamps.

* * * * *